United States Patent
Blöcker et al.

(10) Patent No.: US 7,097,947 B2
(45) Date of Patent: Aug. 29, 2006

(54) METHOD FOR CORRECTING LOCAL LOADING EFFECTS IN THE ETCHING OF PHOTOMASKS

(75) Inventors: Martin Blöcker, München (DE); Gerd Ballhorn, Hohenbrunn (DE); Jens Schneider, München (DE)

(73) Assignee: Infineon Technologies AG, Munich (DE)

( * ) Notice: Subject to any disclaimer, the term of this patent is extended or adjusted under 35 U.S.C. 154(b) by 337 days.

(21) Appl. No.: 10/621,535

(22) Filed: Jul. 17, 2003

(65) Prior Publication Data
US 2005/0079425 A1    Apr. 14, 2005

(30) Foreign Application Priority Data
Jul. 17, 2002    (DE)    ................................. 102 33 205

(51) Int. Cl.
*G01F 9/00* (2006.01)
*G06F 17/50* (2006.01)

(52) U.S. Cl. ............................................. 430/5; 716/19

(58) Field of Classification Search .................... 430/5, 430/30, 311–313; 716/19–21, 1, 4, 5
See application file for complete search history.

(56) References Cited

U.S. PATENT DOCUMENTS

| 5,552,996 A * | 9/1996 | Hoffman et al. ............. 700/121 |
| 6,584,609 B1 * | 6/2003 | Pierrat et al. .................. 716/19 |
| 6,684,382 B1 * | 1/2004 | Liu ............................. 716/19 |

FOREIGN PATENT DOCUMENTS

DE    198 46 503 A1    9/1999

* cited by examiner

*Primary Examiner*—S. Rosasco
(74) *Attorney, Agent, or Firm*—Laurence A. Greenberg; Werner H. Stemer; Ralph E. Locher

(57) ABSTRACT

A method for correcting local loading-effects in photomask etching includes the steps of determining the location-dependent density of structures of a mask; determining the location-dependent strength of the loading effect with the aid of the structure density; and determining location-dependent correction values for the mask structures with the aid of the strength of the loading effect for the purpose of compensating the loading effect. It is recognized that the strength of location-dependent loading effects can be predicted with the aid of the location-dependent structure density and therefore compensated.

9 Claims, 1 Drawing Sheet

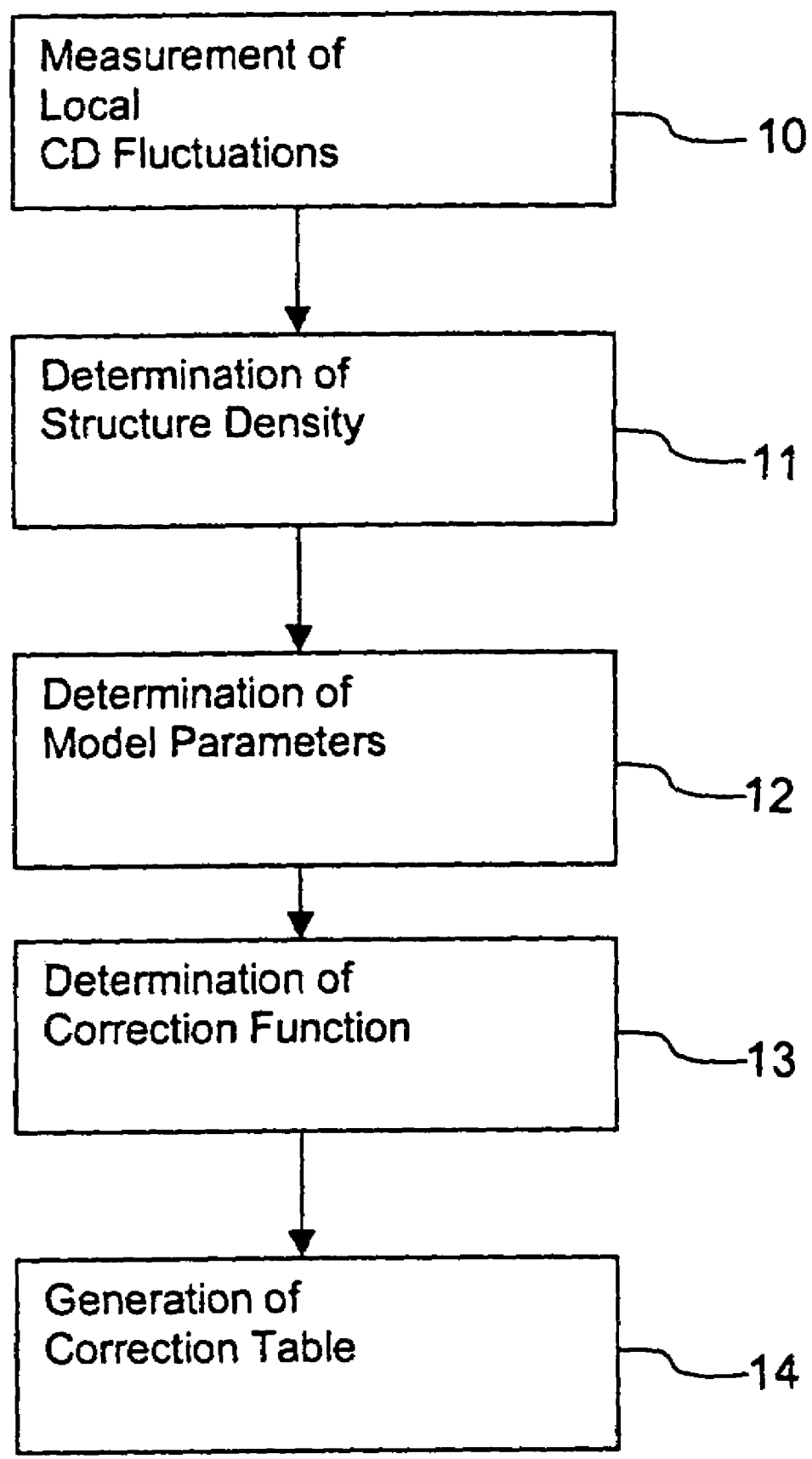

METHOD FOR CORRECTING LOCAL LOADING EFFECTS IN THE ETCHING OF PHOTOMASKS

BACKGROUND OF THE INVENTION

Field of the Invention

With the great advances being made in microelectronics, the structures of integrated circuits become smaller and smaller, and the number of elements on a silicon wafer, such as transistors, diodes, resistors, capacitors, and interconnects, becomes larger and larger.

In photolithographic fabrication methods, such structures are fabricated by coating the surface of a silicon substrate with a photosensitive resist and exposing this with the aid of a mask at locations where intervention will subsequently take place. The photosensitive resist can be eroded easily at the exposed locations, so that the silicon surface is cleared for etching purposes.

Fluctuations of the structural dimensions are the most common problem with fabricating semiconductor structures by lithography using a mask. The root cause of fluctuations of structural dimensions is found in individual steps of the fabrication process, for instance the mask development, mask etching, wafer exposure, wafer developing, etc., but also in lens errors of the devices utilized in the fabrication process, such as errors in the stepper and scanner.

Fluctuations of structural dimensions also influence the critical dimension (CD) of the mask. The CD indicates a characteristic dimension to be generated in the mask fabrication or chip fabrication.

In particular, processing effects in photolithographic mask fabrication can lead to local CD fluctuations. Such processing effects include fogging in electron beam writers, loading in dry etching, or radial effects in connection with spin processing during developing or wet etching.

Fogging occurs when a portion of the electrons of the electron beam that impinges the mask surface is reflected to the electron beam writer and from there back onto the mask surface. Electron irradiation thus occurs in regions of the mask where structure fabrication is not intended.

In loading, a portion of the etchant that is utilized for etching the structures is absorbed by the photosensitive resist located in regions of the mask surface. This leads to CD fluctuations particularly on the margins of the mask region that is to be exposed.

Radial effects occur in spin processing, whereby the mask is rotated for purposes of achieving a uniform coating of developer medium, for example. But the rotation exerts a weaker effect near the axis of rotation than in regions farther removed from the axis of rotation. As a result, a higher concentration of developer can occur near the axis of rotation than in the margin regions of the mask.

Overall, the standard deviation of the CD on the masks is increased by these and similar effects, and therefore the required specifications cannot be maintained.

Within certain limits, such effects can be eliminated by processing improvements such as changing the etch chemistry in order to reduce loading effects. But that is expensive and leads to high costs in the mask and/or chip fabrication.

Furthermore, given design data with sharp variations of local coverage density (e.g. logic with eDRAM), variations of the CD resulting from loading effects must be corrected locally. This is often impossible to achieve by processing improvements alone.

SUMMARY OF THE INVENTION

It is accordingly an object of the invention to provide a method for correcting local loading effects in the etching of photomasks that overcomes the above-mentioned disadvantages of the prior art methods of this general type, in which CD fluctuations in mask fabrication are compensated for.

With the foregoing and other objects in view there is provided, in accordance with the invention, a method for correcting local loading effects during etching of photomasks. The method includes determining a location-dependent density of mask structures resulting in a structure density; determining a location-dependent strength of a loading effect with an aid of the structure density; and determining location-dependent correction values for the mask structures using the location-dependent strength of the loading effect for compensating for the loading effect.

The invention is based on the recognition that the strength of location-dependent loading effects can be predicted with the aid of the location-dependent structure density, and the effects can be compensated.

The advantage of the method is its general utility on masks with random structure density distributions.

The location-dependent density $d(x,y)$ of the mask structures can be determined by analyzing the location-dependent bright field portion of the mask surface that is to be generated. Dark portions correspond to the mask structures, while bright portions correspond to the interspaces between the structures.

Specifically, the following density pseudo-function can be formed:

$$p_\sigma(x,y) = [d g_\sigma](x,y)$$

which models the local influences of the loading effects by a convolution of the density function $d(x,y)$ with a Gauss function $$g_\sigma(x,y) = \frac{1}{\sigma^2} e^{-(x^2+y^2)/\sigma^2}$$

Here, the length $\sigma$ describes the extent of the loading effect.

In a subsequent step, the location-dependent shifting of the edges of the mask structures can be computed with the aid of the strength of the loading effect, whereby the correction values compensate the location-dependent shift. In particular, the following equation applies to the shift of the structure edges at a location $(x,y)$:

$$s(x,y) = m(t_0 - p_\sigma(x,y)).$$

The function $s(x,y)$ depends on the parameters $\sigma$, $m$ and $t_0$. $m$ describes the strength of the loading effect and in units of length/density (e.g. nm/(1/μm^2). $t_0$ is a reference density with which the pseudo-density $p_\sigma(x,y)$ for which no edge shift occurs is selected. The model parameters $\sigma$, $m$ and $t_0$ are determined with the aid of measurements at uncorrected masks. Their values are strongly dependent on the etch process that is employed.

The correction function that is needed for compensation is now formed by inverting the sign of m from the function $s(x,y)$.

In the next steps, the mask surface can be partitioned into subregions, and a correction value can be assigned to each of the subregions. This simplifies the correction of the mask structures. The finer the partitioning of the mask surface into subregions, the more precise the correction, though the computing expenditure is also greater.

In particular, a table can be created which allocates a correction value to each subregion. That way, a correction can be carried out particularly easily.

Besides this, a data processing system is inventively created for configuring the layout of a mask, whereby the data processing system is configured for reading design data representing the layout of a mask including mask structures which are to be fabricated and processing the design data for the correction of the mask layout represented by the design data by the above described method for correcting mask structures.

The invention further provides a data processing system for configuring the layout of a mask whereby the data processing system is configured for reading first design data representing the layout of a mask including mask structures which are to be fabricated, processing the first design data in order to determine a location-dependent density of the mask structures, determining a location-dependent strength of a loading effect with the aid of the structure density, determining location-dependent correction values for the mask structures with the aid of the strength of the loading effect, and generating second design data representing a layout, which has been corrected with the aid of the correction values, of the mask that is to fabricated.

Besides this, a computer program is created for designing the layout of a mask and correcting mask structures according to the method for correcting mask structures on a computer.

Other features which are considered as characteristic for the invention are set forth in the appended claims.

Although the invention is illustrated and described herein as embodied in a method for correcting local loading effects in the etching of photomasks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a flow chart describing a method for correcting local loading effects in the etching of a photomask according to the invention.

DESCRIPTION OF THE PREFERRED EMBODIMENTS

Referring now to the single FIGURE of the drawing in detail, there in shown a first step 10 in which local CD fluctuations are measured on an uncorrected mask. In order to take this measurement, a mask is fabricated without applying the inventive correction method.

In a subsequent step 11, the density of structures of a mask that is to be fabricated is determined. This determination is made by processing the design data representing the layout of the mask that is to be fabricated. The design data are analyzed therein with respect to the local bright field portion $d(x,y)$ with $0 \leq d(x,y) \leq 1$.

The structure edges are shifted by the physical-chemical processing of the mask in dependence on the local strength of the coverage-density-related effect. The equation for the shift at point (x,y) on the mask is $$s(x,y)=m(t_0-p_\sigma(x,y)),$$

where model parameters $\sigma$, m and $t_0$ are determined in step 12 by adapting the shift function $s(x,y)$ to the measurement data from step 11. Alternatively, if the etch process is sufficiently stable, the parameters can also be derived from previously known data, without an uncorrected mask having to be produced in step 11. The model can be utilized for compensating the loading effect by inverting the sign $m(m \rightarrow -m)$. To that end, in a further step 13, the design data are processed in such a way that the mask layout they represent is corrected according to the model.

The correction can be performed particularly by generating a local table of quantities containing location-dependent correction values (step 14). With the aid of the table, different regions of the mask surface can be assigned different correction values. The correction values serve for adapting the sizes of the mask structures and thus compensating the shift of the structure edges based on the location-dependent loading effect.

Note that the invention is not limited to the described exemplifying embodiment but rather encompasses modifications within the scope of protection defined by the claims.

We claim:

1. A method for correcting local loading effects during etching of photomasks, which comprises the following steps:

determining a location-dependent density of mask structures resulting in a structure density, the determining step including:
      forming a density function $d(x,y)$ for determining the location dependent density of the mask structures;
   determining a location-dependent strength of a loading effect with an aid of the structure density, the determining step including:
      determining the location-dependent strength of the loading effect by a convolution of the density function with a Gauss function; and
   determining location-dependent correction values for the mask structures using the location-dependent strength of the loading effect for compensating for the loading effect.

2. The method according to claim 1, which further comprises determining the location-dependent density of the mask structures by analyzing a location-dependent bright field proportion of a mask surface that is to be generated.

3. The method according to claim 1, which further comprises determining a location-dependent shift of edges of the mask structures with an aid of the location-dependent strength of the loading effect, the location-dependent correction values compensating for the location-dependent shift of the edges of the mask structures.

4. The method according to claim 3, which further comprises using an equation for the location-dependent shift of the edges at point (x,y) on the mask surface being:

$$s(x,y)=m(t_0-p_\sigma(x,y)),$$

whereby $p_\sigma(x,y)$ is a density pseudo-function, and model parameters $\sigma$, m and $t_0$ are determined with an aid of measurements of uncorrected masks.

5. The method according to claim 4, which further comprises calculating the density pseudo-function $p_\sigma(x,y)$ by convolution of the density function $d(x,y)$ of the mask structures with the Gauss function of a range $\sigma$.

6. The method according to claim 4, which further comprises determining the location-dependent correction values by use of a correction function formed by inverting a sign of m from a function s(x,y).

7. The method according to claim 1, which further comprises:
   partitioning a mask surface into subregions; and
   assigning a location-dependent correction value to each of the subregions.

8. The method according to claim 7, which further comprises creating a table for allocating the location-dependent correction value to each of the subregions.

9. A computer program for configuring a layout of a mask and correcting mask structures: comprising:
   computer executable instructions for carrying out the method according to claim 1.

* * * * *